United States Patent
Culbertson

[11] 3,967,385
[45] July 6, 1976

[54] UTILIZATION OF HEAT PIPES FOR COOLING RADIATION CURING SYSTEMS

[75] Inventor: Donald L. Culbertson, Mountain Lakes, N.J.

[73] Assignee: National-Standard Company, Wagner-Litho Machinery Division, Secaucus, N.J.

[22] Filed: Aug. 26, 1974

[21] Appl. No.: 500,576

[52] U.S. Cl. .................. 34/4; 165/105; 219/343; 240/47; 240/44.1
[51] Int. Cl.² ...................... F26B 3/34
[58] Field of Search ............... 34/1, 4; 165/47, 105; 219/343; 240/47; 350/1; 353/54, 52

[56] References Cited
UNITED STATES PATENTS

| | | | |
|---|---|---|---|
| 1,700,840 | 2/1929 | Gay | 165/105 X |
| 3,715,610 | 2/1973 | Brinkman | 165/105 X |
| 3,724,215 | 4/1973 | Neudecker et al. | 165/105 X |
| 3,749,163 | 7/1973 | Waters | 165/105 X |
| 3,779,310 | 12/1973 | Russell | 165/105 |
| 3,819,929 | 6/1974 | Newman | 240/47 X |
| 3,826,014 | 7/1974 | Helding | 34/4 |

Primary Examiner—Albert W. Davis, Jr.

[57] ABSTRACT

Apparatus for curing solvent-free inks, coatings and the like in which the apparatus includes moving work, conveyor means for the moving work, an assembly including ultraviolet producing source and reflector partially encasing the ultraviolet producing source and adapted to reflect the radiant energy from the ultraviolet producing source toward the moving work, closable shutter means for blocking the radiant energy from the ultraviolet producing source from impinging upon the moving work when the operation of the system is temporarily interrupted. The reflector, the shutter means, as well as the conveyor, are provided with a plurality of spaced heat pipes contiguously affixed thereto and adapted to cool these elements.

6 Claims, 9 Drawing Figures

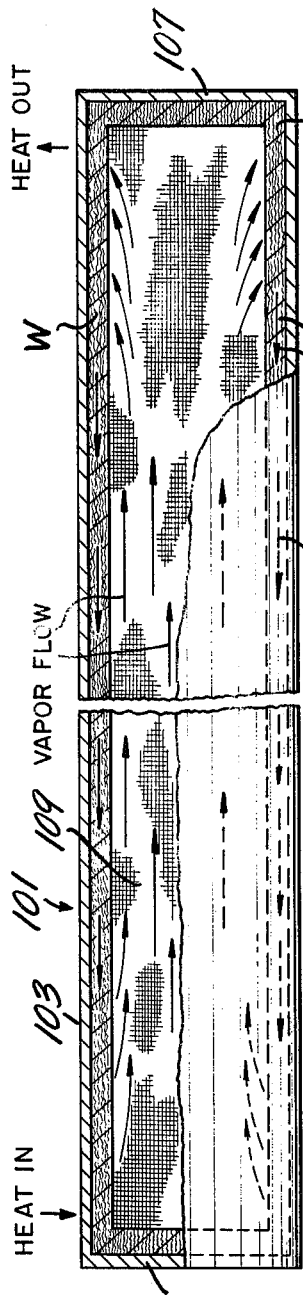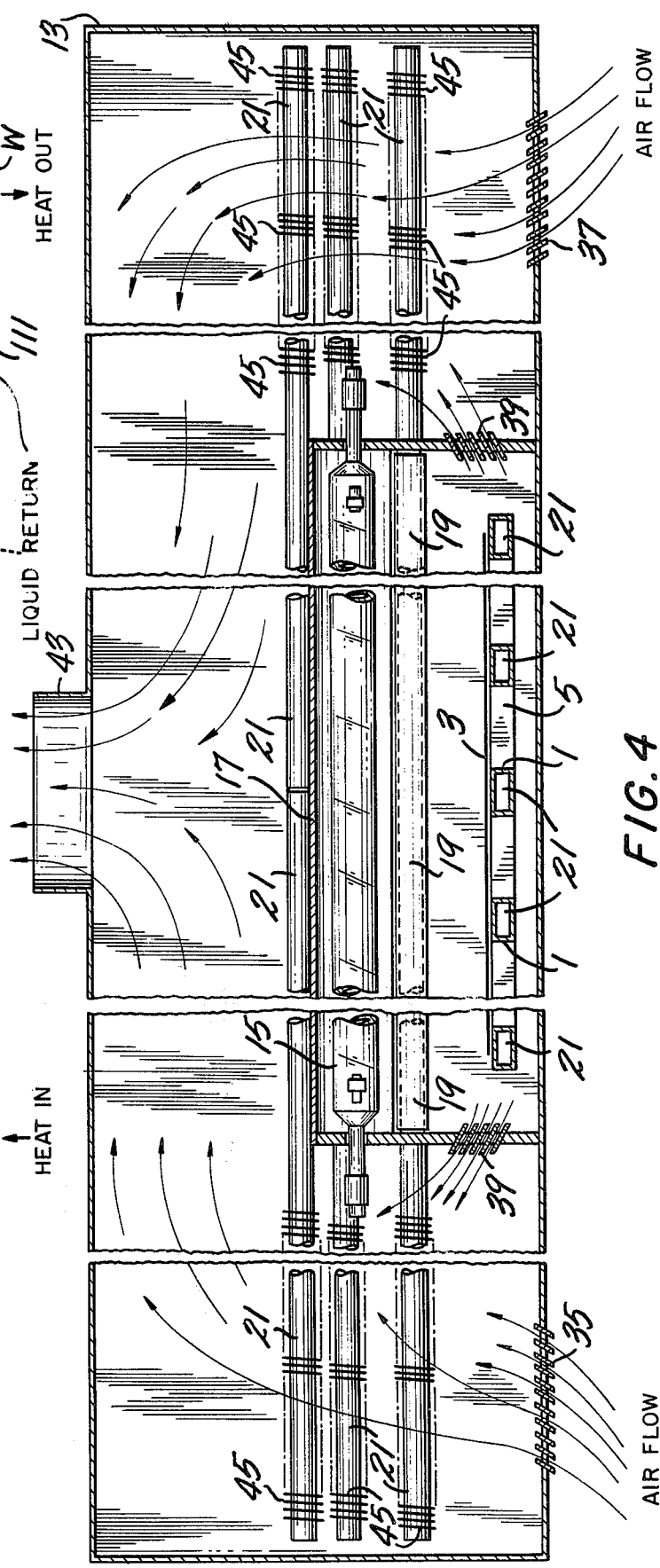

UTILIZATION OF HEAT PIPES FOR COOLING RADIATION CURING SYSTEMS

BACKGROUND OF THE INVENTION

1. Field of Invention

This invention relates to an apparatus for curing solvent-free inks, coatings and the like, and it is particularly related to an improved cooling means used therein. More specifically, the present invention is concerned with the utilization of heat pipes for effective cooling in such curing apparatus.

2. Prior Art

As described in U.S. Pat. No. 3,745,307 which was granted to Sandford C. Peek, Jr., on July 10, 1953, solvent-free inks and coatings have recently found increasing industrial utilization in view of the air pollution problems associated with the use of solvent-bearing materials. Curing of such solvent-free inks, coatings and the like is effected by radiation in the ultraviolet and electron beam frequencies, and the curing operation is marked by absence of solvent evaporation and atmospheric pollution.

Basically, the operation described in the aforesaid patent comprises passing a sheet or a web of a printed material below a series of ultraviolet lamps, each lamp being encased within a reflector adapted to direct the radiation toward the moving work. A series of ultraviolet lamps with their associated reflectors, and a varying speed moving work provide for photopolymerization or curing of the solvent-free ink or coating. In order to avoid formation of hot spots in, or overheating of the printed material, each reflector is provided with a shutter means which closes in response to a signal, thus blocking the radiation and preventing it from impinging upon the moving work in order to avoid damage thereto which may otherwise result from excessive or prolonged exposure. Overheating of the ultraviolet lamps, the reflectors and the shutter means is prevented by forced-air cooling of these elements.

Air cooling of ultraviolet lamps, the reflectors and the shutter means in such curing apparatus is but one of the two principal means heretofore employed in the prior art for cooling these elements, while water cooling constitutes the other. However, both air cooling and water cooling have inherent disadvantages. When using air, for example, the rate of heat transfer is inherently low, thus requiring large volumes of air for effective cooling particularly in large scale installations. Additionally, excessive air currents around the lamps' main envelopes cause condensation of mercury and extinguishes the lamps, thus necessitating delay in start up and causing a shortened lamp life.

The main disadvantage of water cooling is from safety standpoint. Since the ultraviolet lamps usually operate at high voltage (approximately 1600 volts) and about 7 amperes, water around the lamps presents the danger of causing a lethal situation to the operating personnel in case of a leak. Accordingly, extreme precautions must be taken to avoid creating such hazzardous conditions.

BRIEF DESCRIPTION OF THE INVENTION

This invention contemplates providing a safe and more effective cooling means in apparatus employed for curing solvent-free inks, coatings and the like. In its specific aspect, the present invention employs heat pipes, rather than air or water, for cooling the main lamps' envelopes, the reflectors, and the shutters as well as the conveyor or the support member for the moving work in such curing apparatus, thereby eliminating the disadvantages and dangers which are inherent in air cooling or water cooling of these elements. These and other aspects of this invention will become more apparent from the following detailed description of the invention, taken in conjunction with the accompanying drawings wherein like numerals are employed to designate like parts.

THE DRAWINGS

FIG. 4 is a side elevational view taken along the line IV—IV of FIG. 2.

FIG. 8 is a side sectional view of a typical heat pipe which can be employed in the present invention.

DETAILED DESCRIPTION OF THE INVENTION

Figure 1:
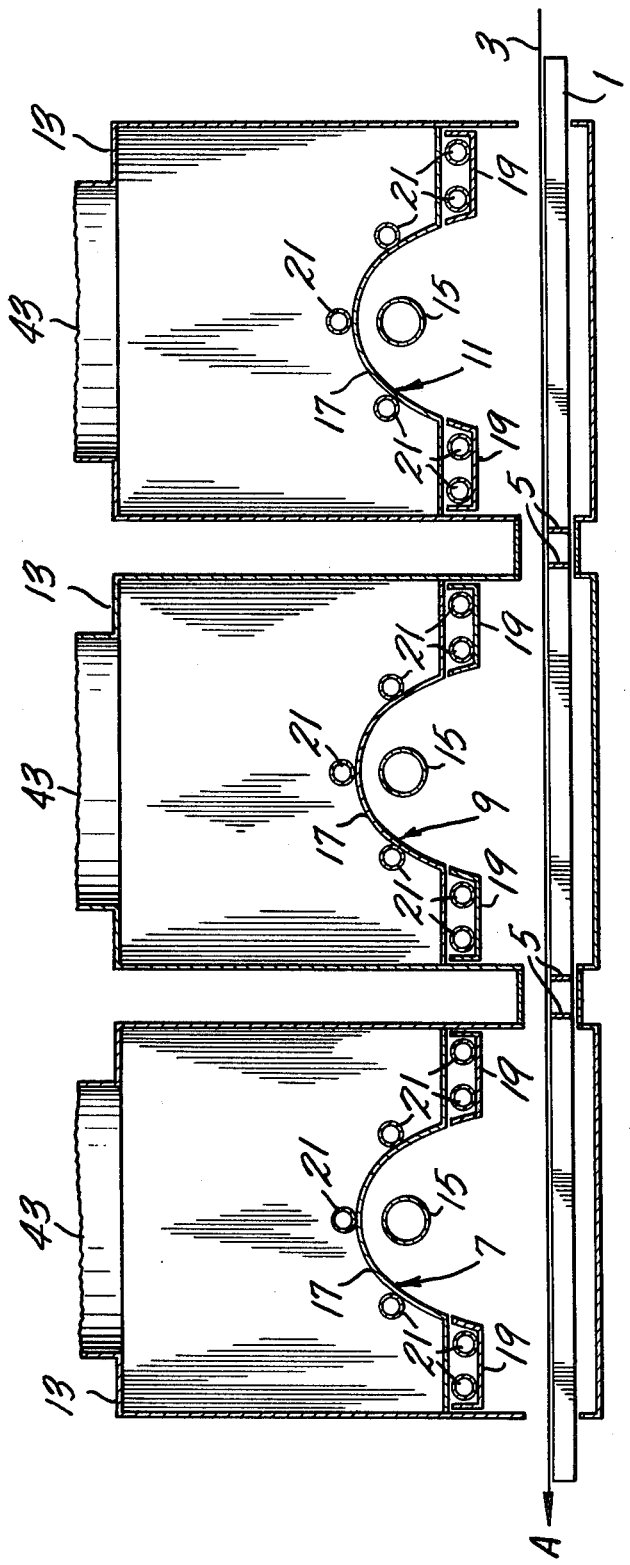
FIG. 1 is a schematic diagram illustrating the relative arrangements of the ultraviolet lamps, their associated reflectors, shutter means, heat pipes, and the moving work.

Before describing the present invention in detail, it must preliminarily be mentioned that "heat pipes" have been known in the prior art for some time. A heat pipe is basically a closed container under vacuum which contains a small amount of a vaporizable fluid, and, in some heat pipes, a capillary-wick structure. FIG. 8 shows a typical heat pipe 101 which comprises a container 103 which may conveniently be a pipe or a tubular member, and which is evacuated and sealed at both ends 105 and 107. A capillary-wick material W is disposed within the container 103 and a small amount of a vaporizable fluid is vaporized within the evaporator section 109, the heat of vaporization for the vaporizable fluid being provided by a heat source externally of the heat pipe. Thus, the fluid F vaporizes at the heated end 105, flows through the evaporator section 109 in the direction of the center arrows as indicated in FIG. 8 and condenses at the condensing end 107.

The condensation of the vapors at the condensing end 107 is accompanied by the release of the latent heat of vaporization which is transferred to the exterior of the heat pipe 101 and removed by an air stream as hereinafter explained in connection with FIG. 4. The liquid resulting from the condensation of the vapors at the condensing end 107 of the heat pipe 101 is returned to the heated end 105 through the return line 111 by the capillary action of the wick material W thus completing a vaporization-condensation cycle within the heat pipe 101.

It will be seen therefore that a heat pipe can be employed to transport heat between a heat source and a heat sink with a very small temperature loss since the operation within the heat pipe is essentially isothermal. Since the heat of vaporization of a fluid is usually several orders of magnitude larger than the sensible heat in conventional heat transfer equipment with equivalent temperature differentials, considerable heat can be transferred by the use of heat pipes rather than conventional heat transfer systems. Moreover, such large amounts of heat can be transferred with rather small, lightweight heat pipes.

Another important feature of heat pipes is that they may be made in various sizes and shapes. Thus, they may be round, square, rectangular or irregular in shape.

For a more detailed discussion of heat pipes and the methods of their operation, see, for example, U.S. Pat. Nos. 2,350,348; 3,229,759 and 3,305,005, the disclosures of which are fully incorporated herein by reference.

Figure 9:
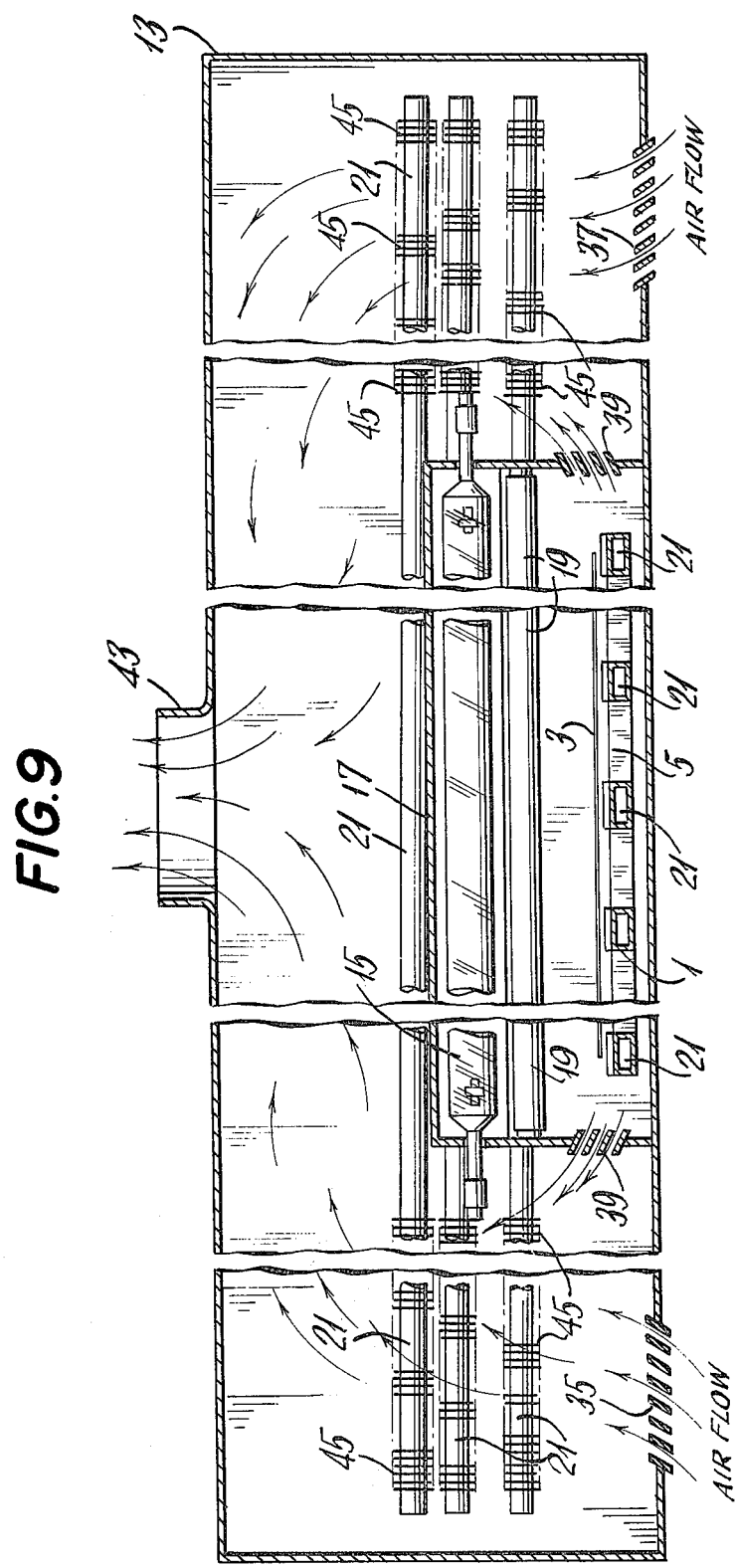
FIG. 9 is a side elevational view similar to FIG. 4 but wherein the heat pipe is shown at a slight angle of inclination.

The use of capillary-wick material is not always necessary for the operation of a heat pipe. In some cases, the heat pipe may be positioned at an angle of inclination as shown in FIG. 9 in order to facilitate the gravity return of the condensed liquid within the heat pipe.

Referring now to FIGS. 1–7, and specifically to FIG. 1, there is shown a conveyor 1 supporting a moving work such as a web or a sheet 3 consisting of a suitable substrate coated with a solvent-free ink travelling in the direction of the arrow A. The conveyor 1 usually consists of several railings connected by the tie bars 5, and is driven by a variable speed motor (not shown) in order to vary the speed of travel of the moving work.

Figure 2:
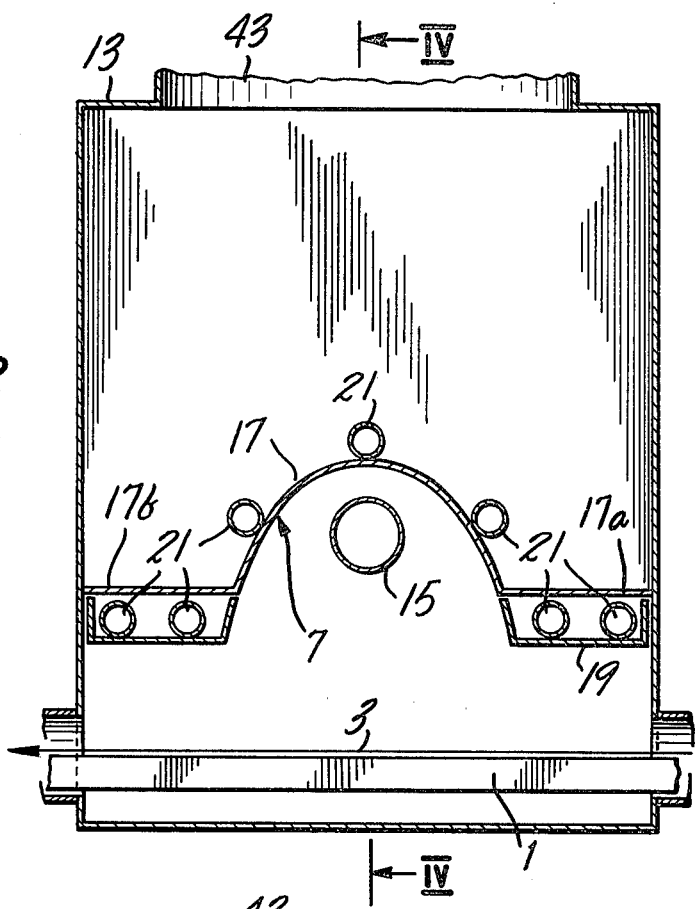
FIG. 2 is an end elevational view of an assembly embodying the novel features of this invention, and wherein the shutter means is in an open position.

The sheet 3 passes beneath a series of ultraviolet lamp-reflector assemblies 7, 9 and 11 disposed within the housing 13. Although only three such assemblies are shown in FIG. 1 for the purpose of illustration, it is understood, of course, that any number of such assemblies may be employed for different curing systems. In all cases, however, these assemblies are identical in construction and operation and, therefore, the details of only one of these assemblies are shown in FIG. 2.

Thus, the assembly 7 includes an ultraviolet lamp 15 suitably positioned in and encased within a generally elliptical reflector 17 whose extending members 17a and 17b are supported by the housing 13. The ultraviolet lamp 15 is of the type and variety usually employed in such curing systems. The reflector 17 is generally made of a sheet metal of relatively thin stock, and it is of durable construction, with a highly reflective surface in order to focus the radiant energy from the ultraviolet lamp toward the moving work. Suitable metals for the construction of the reflector 17 include aluminum alloys sold under the tradenames Lurium and Alzak as mentioned in the aforesaid patent issued to Sandford C. Peek, Jr.

Figure 3:
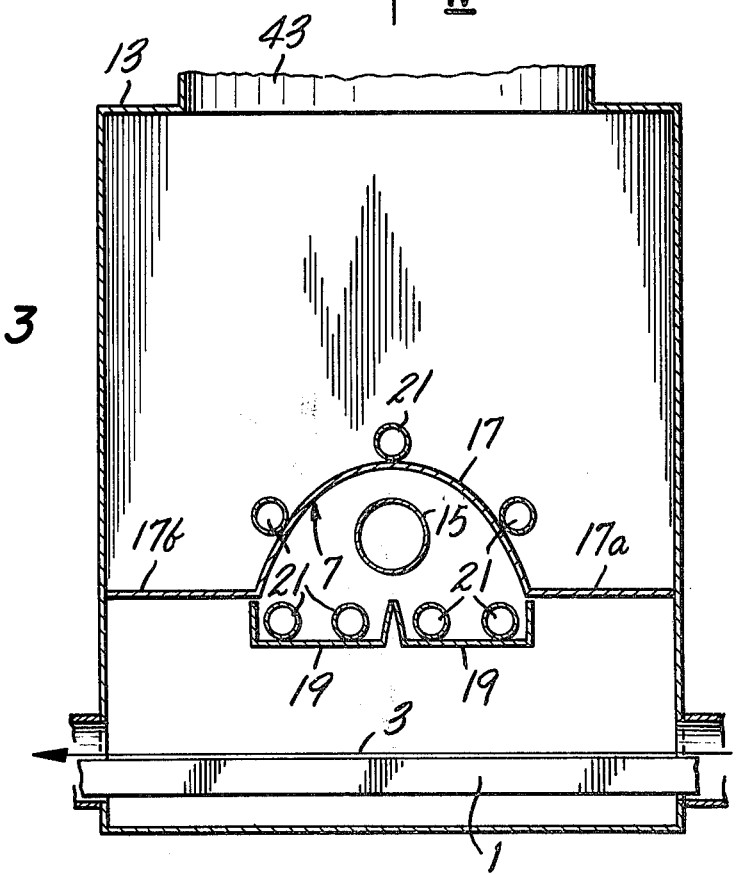
FIG. 3 is a view similar to FIG. 2 but wherein the shutter means is in closed position.

The assembly 7 also includes a metallic shutter means 19 which is slidably movable pneumatically, hydraulically or by mechanical means (not shown), and serves to block the radiation from the ultraviolet lamp 15 from impinging on the moving work (sheet 3) whenever the operation of the system is temporarily interrupted. Thus the operation of the shutter means 19 may be coordinated with the operation of the conveyor 1 so that the shutter means 19 will be closed when the conveyor 1 is temporarily halted or its speed considerably reduced. FIG. 3 illustrates the assembly shown in FIG. 2 but wherein the shutter means 19 is in closed position.

As it was previously stated when the shutter means is closed the radiant energy from the ultraviolet lamps will be absorbed partly by the shutter means and partly by the reflector. In order to avoid overheating of these elements, the conventional practice has heretofore been to cool them by air or by water. However, as it was also previously noted the practice of cooling by air or water has inherent disadvantages.

It has now been unexpectedly discovered that instead of cooling by air or water as it has been customary to do in the prior art, each assembly can be provided with a plurality of heat pipes, the number of which can vary depending, inter alia, on the size of the assembly. Thus it is within the contemplation of this invention that the assembly 7 include a plurality of heat pipes 21 having the general construction and configuration shown in FIG. 8, supra. Heat pipes 21 extend contiguously along the surface of the reflector 17 and shutter means 19 and serve to cool both of these elements not only when the shutter means is closed but also during normal operation of the system. In addition, the conveyor 1 may also be provided with such heat pipes thus providing cooling means for the moving work and the conveyor.

Figure 5:
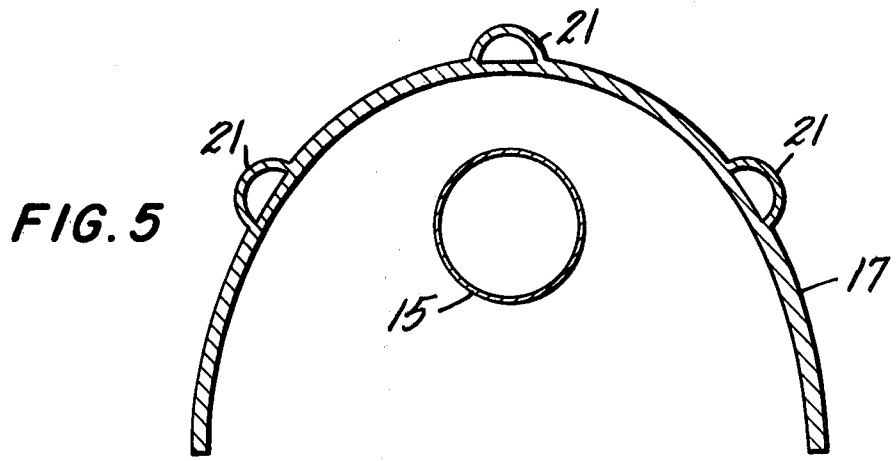
FIGS. 5–7 are views similar to FIG. 2 but illustrating different embodiments of the invention with different arrangements of the heat pipes and the shutter means.
Figure 6:
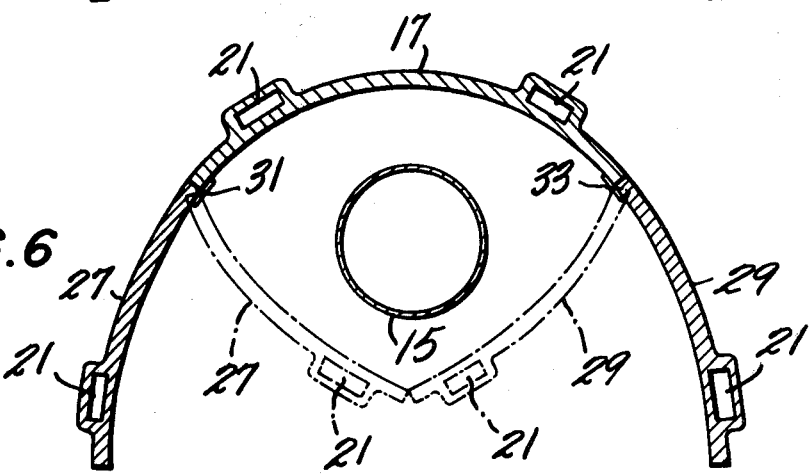
Figure 7:
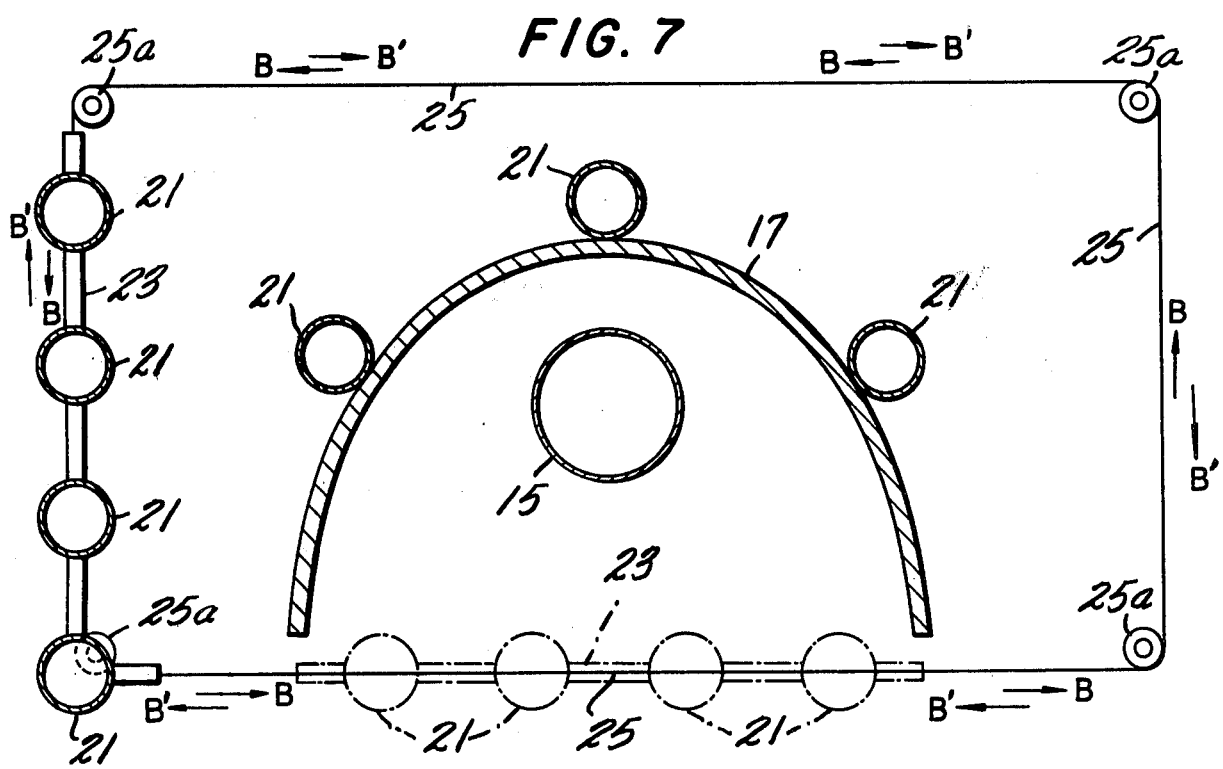

In the assembly illustrated by FIG. 2, the heat pipes 21 are affixed on the exterior surface of the reflector 17 and the interior surface of shutter means 19. This arrangement, however, is not intended to limit the relative positions of these elements since these heat pipes may, if desired, be affixed to the interior or the exterior surfaces of the reflector 17 and shutter means 19 without affecting their advantageous utilization for the purpose of this invention. Furthermore, the heat pipes 21 may be embedded within the reflector 17 as shown in FIGS. 5 and 6, or they may be integrally affixed to an elongated metallic member 23 as shown in FIG. 7 in which the elongated generally metallic member 23 is adapted to traverse the path indicated by the arrows B and B' by the forward and backward motion of the chain 25 which is guided by the sprockets 25a. It is apparent from FIG. 7 that the elongated member 23 constitutes the shutter means in this assembly as shown therein.

FIG. 6 is intended to illustrate yet another arrangement in which the reflector 17 includes the reflector extensions 27 and 29 which are hinged at 31 and 33. The reflector extensions 27 and 29 are adapted to fold interiorly of the reflector 17 in response to an external signal (not shown), thus defining the shutter means for the assembly shown in this figure.

The operation of the invention will now be illustrated with particular reference to FIGS. 1–4. As the sheet 3 passes transversely beneath the ultraviolet lamps 15, the solvent-free ink is cured by the radiant energy emanating from these lamps which impinges upon the moving work directly, and by reflection from the reflector 17. When the operation of the system is temporarily interrupted, as it was previously mentioned, the shutter means 19 will be closed and, together with the reflectors 17 will constitute the heat sink for the radiant energy, and unless they are adequately cooled, they may be irreparably damaged. Heat pipes 21 thus serve to cool these elements as follows. The heat which is absorbed by the heat pipes 21 from their associated reflectors or shutter means will serve to vaporize the vaporizable fluid (e.g., water) at the heated end of the heat pipe as was previously described. The vaporized fluid flows through the evaporator section of the heat pipe, condenses at the cold end thereof, and the condensed liquid is returned to the heated end of the heat pipe by the capillary action of the capillary-wick material thereby completing vaporization-condensation cycle within the heat pipe. Since the vaporization of fluids generally requires large amount of heat, the amount of which depends, naturally, on the nature of the fluid, considerable heat will be removed from the heat source (i.e., the reflectors and the shutter means) thereby cooling these elements.

In order to remove the heat of vaporization released at the condensing ends of the heat pipes 21, air is drawn through inlet ports 35, 37, 39 and 41, passed over and around the condensing ends of the heat pipes and exhausted through the outlet port 43. Furthermore, the heat transfer efficiency of the heat pipes at their condensing ends may be improved by providing them with external fins 45 as shown in FIG. 4.

In the embodiment illustrated in FIG. 4 the heat pipes are shown in a generally parallel position relative to each other and to the reflector assembly as well as the shutter means. In other instances in which heat pipes are employed which do not contain a capillary-wick material, the heat pipes must be installed at an angle of inclination relative to the heat sources (the reflectors, the shutter means and the conveyor) in order to facilitate the return of the liquid from the condensing end of the heat pipe toward its heated end. Otherwise, the operation of the heat pipes is essentially the same as hereinbefore described except that the liquid will be returned to the heated end of the heat pipe by gravity flow rather than by the capillary action of the capillary-wick material.

It is apparent from the foregoing detailed description of the invention that many changes and modifications may be made therein which will nevertheless be comprehended within spirit and scope of this invention. Such modifications may include, but they are not limited to, the shapes and sizes of the heat pipes, the nature of the vaporizable fluid used therein, the relative geometrical positions and configurations of the heat pipes in the apparatus. In addition, while in the foregoing description and the corresponding drawings the radiant energy means is shown above the moving work, this arrangement is not intended to limit the relative arrangements of these parts. In general, the radiant energy means need only be positioned at suitable finite distances away from the moving work in order to focus radiant energy thereon. Thus, the radiant energy means may be disposed laterally, or circumferentially in surrounding relationship with respect to said moving work.

What is claimed is:

1. In an apparatus for curing radiant energy curable material which apparatus includes moving work to which said radiant energy-curable material is applied, a supporting-conveying means for said moving work, radiant energy means in spaced position relative to said moving work, said radiant energy means comprising an ultraviolet producing source and a reflector partially encasing said ultraviolet producing source and adapted to reflect radiant energy from said ultraviolet producing source toward said moving work, shutter means operable to a closed position relative to said radiant energy means for blocking the radiant energy from said ultraviolet producing source from impinging upon said moving work; the improvement which comprises providing in said apparatus a plurality of spaced heat pipes affixed to said reflector and said shutter means for cooling said elements.

2. In an apparatus as in claim 1 wherein a plurality of spaced heat pipes are affixed to said supporting-conveying means.

3. In an apparatus as in claim 1 wherein said heat pipes are in a generally parallel position relative to the longitudinal axes of said reflector and said shutter means.

4. In an apparatus as in claim 1 wherein said heat pipes are in a generally inclined position relative to the longitudinal axes of said reflector and said shutter means.

5. In an apparatus as in claim 1 wherein said heat pipes are embedded in said reflector means.

6. In an apparatus as in claim 1 wherein said heat pipes are embedded in said shutter means.

* * * * *